(12) United States Patent
Abe et al.

(10) Patent No.: US 10,241,370 B2
(45) Date of Patent: Mar. 26, 2019

(54) SEMICONDUCTOR DEVICE AND PROJECTION-TYPE DISPLAY UNIT

(71) Applicant: Sony Corporation, Tokyo (JP)

(72) Inventors: Kazuki Abe, Kumamoto (JP); Shinya Inage, Kumamoto (JP); Nobuhiko Oda, Kumamoto (JP); Masahiro Kaida, Kumamoto (JP); Moriyasu Nagura, Kumamoto (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/774,147

(22) PCT Filed: Oct. 27, 2016

(86) PCT No.: PCT/JP2016/081868
§ 371 (c)(1),
(2) Date: May 7, 2018

(87) PCT Pub. No.: WO2017/086116
PCT Pub. Date: May 26, 2017

(65) Prior Publication Data
US 2018/0329264 A1 Nov. 15, 2018

(30) Foreign Application Priority Data
Nov. 18, 2015 (JP) .................. 2015-225702

(51) Int. Cl.
*H01L 29/786* (2006.01)
*H01L 29/49* (2006.01)
(Continued)

(52) U.S. Cl.
CPC ...... *G02F 1/136209* (2013.01); *G02F 1/1368* (2013.01); *H01L 29/78621* (2013.01)

(58) Field of Classification Search
CPC ............. H01L 27/1214; H01L 27/3244; H01L 29/78633; H01L 29/4908; H01L 29/78621
See application file for complete search history.

(56) References Cited

U.S. PATENT DOCUMENTS

2005/0029521 A1* 2/2005 Yamasaki ......... G02F 1/136213
257/72

FOREIGN PATENT DOCUMENTS

JP 2005-251911 A 9/2005
JP 2006-171136 A 6/2006
(Continued)

OTHER PUBLICATIONS

International Search Report and English translation thereof dated Jan. 24, 2017 in connection with International Application No. PCT/JP2016/081868.
(Continued)

*Primary Examiner* — Caridad Everhart
(74) *Attorney, Agent, or Firm* — Wolf, Greenfield & Sacks, P.C.

(57) ABSTRACT

A semiconductor device according to an embodiment of the disclosure includes: a first substrate; a TFT element provided on the first substrate with a first interlayer insulating layer interposed therebetween, and including a semiconductor layer and a gate electrode that is provided on the semiconductor layer with a gate insulating layer interposed therebetween; and a second substrate disposed to face the first substrate. The gate electrode includes a first electroconductive film and a second electroconductive film that has a light-shielding property in order from side of the semiconductor layer. The second electroconductive film extends from a side face to a bottom face of each of a pair of openings that are provided to interpose the semiconductor layer.

11 Claims, 10 Drawing Sheets

(51) Int. Cl.
*G09F 9/30* (2006.01)
*G02F 1/1362* (2006.01)
*G02F 1/1368* (2006.01)

(56) References Cited

FOREIGN PATENT DOCUMENTS

| | | |
|---|---|---|
| JP | 2011-203288 A | 10/2011 |
| JP | 2012-108407 A | 6/2012 |
| JP | 2013-057823 A | 3/2013 |

OTHER PUBLICATIONS

Written Opinion and English translation thereof dated Jan. 24, 2017 in connection with International Application No. PCT/JP2016/081868.

International Preliminary Report on Patentability and English translation thereof dated May 31, 2018 in connection with International Application No. PCT/JP2016/081868.

* cited by examiner

[FIG. 1]
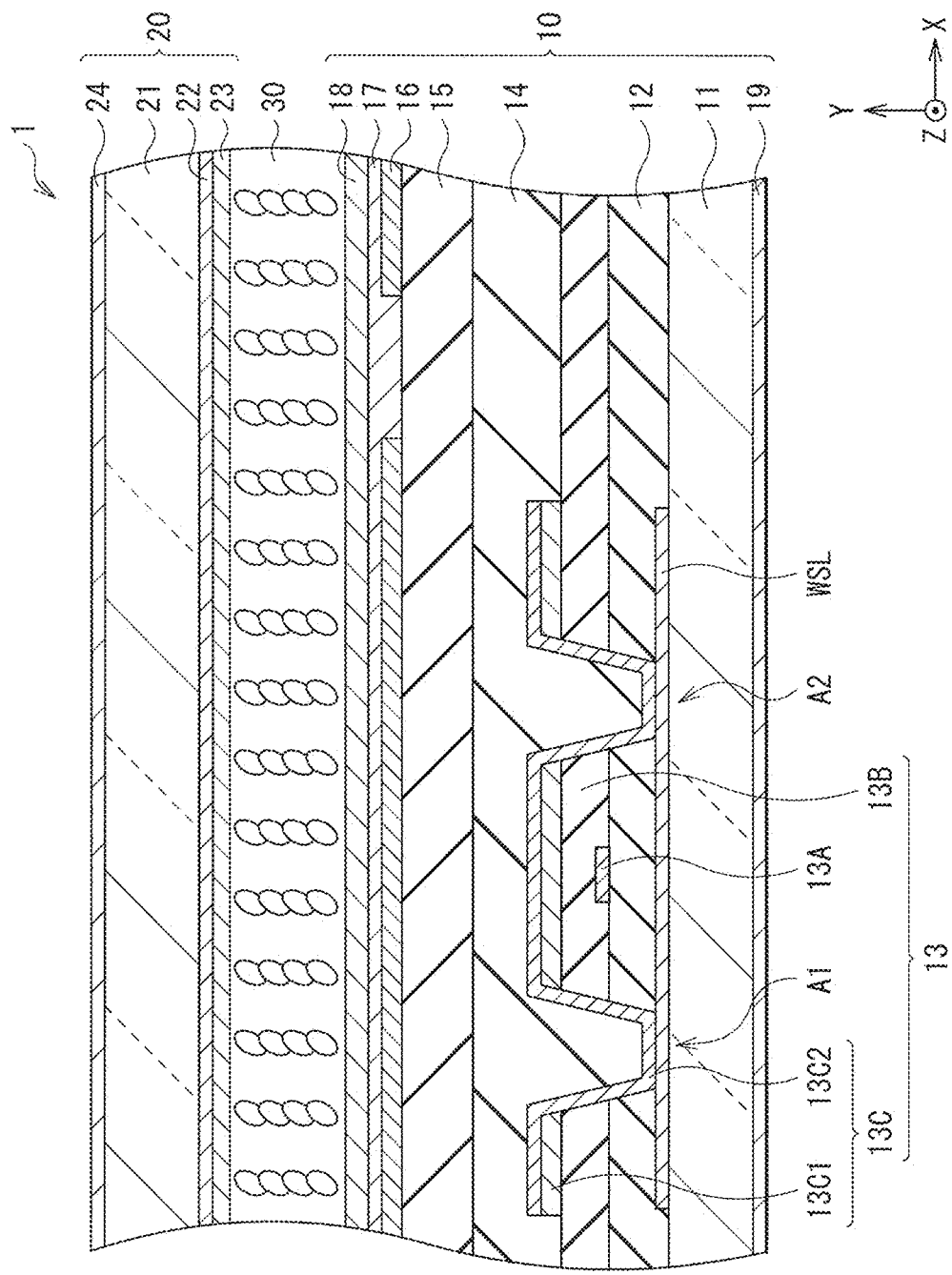

[ FIG. 2A ]
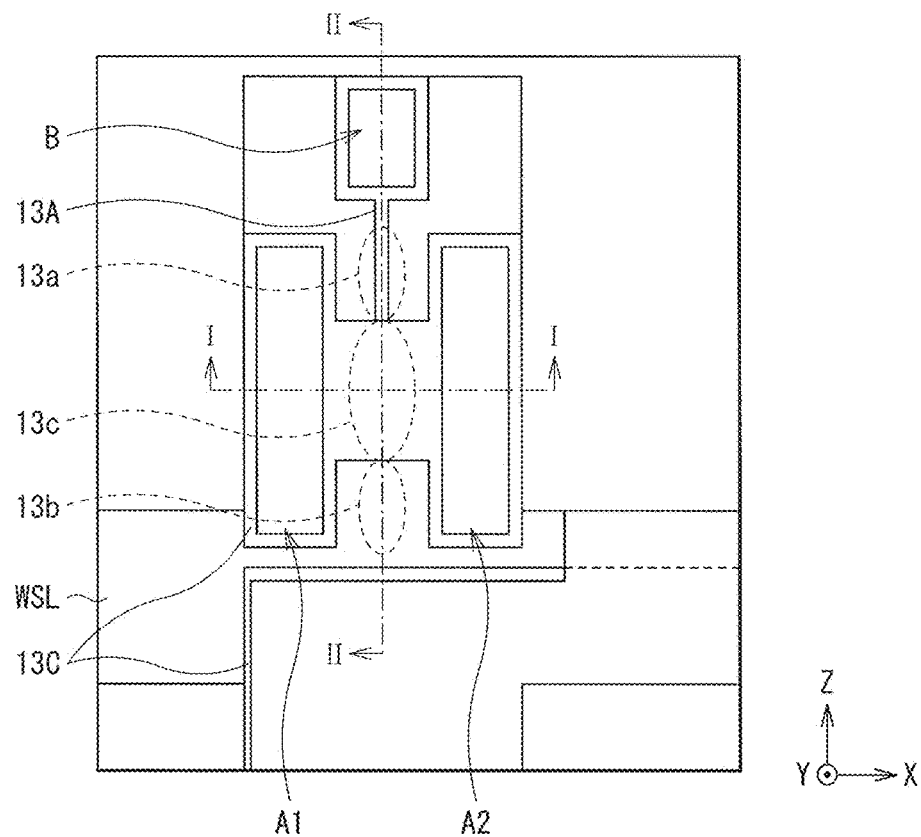
[ FIG. 2B ]
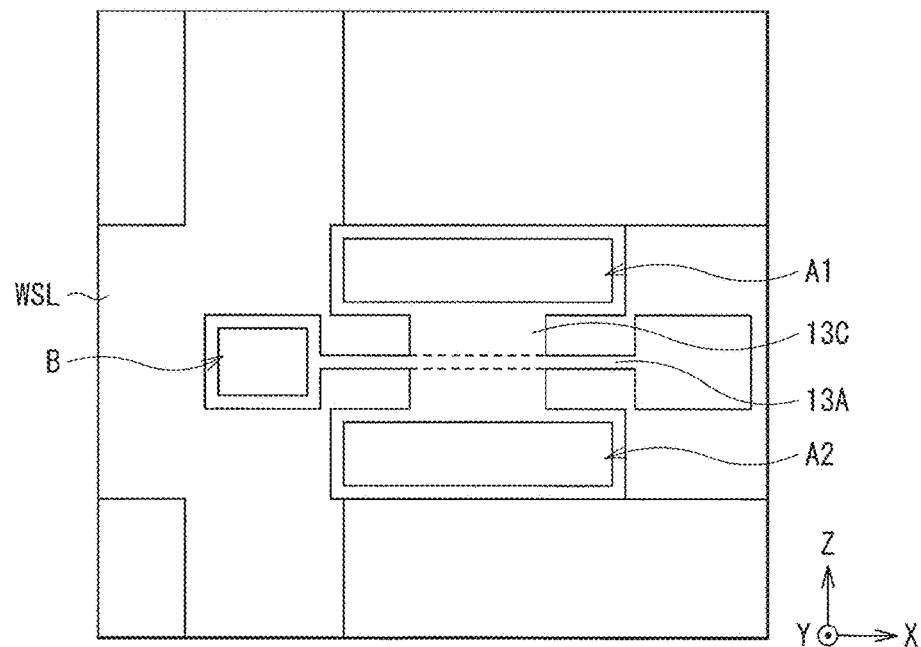

[FIG. 3]
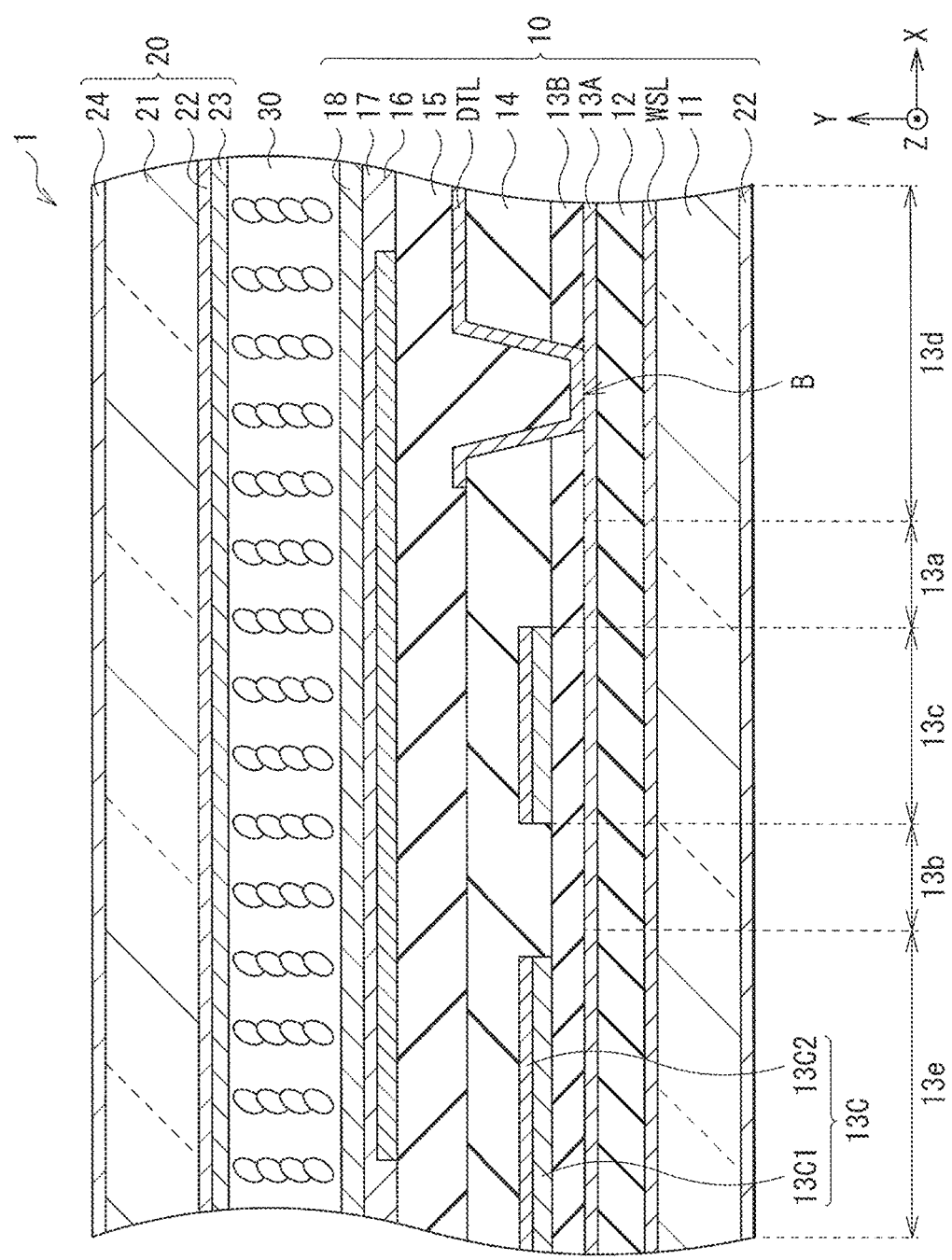

[FIG. 4]
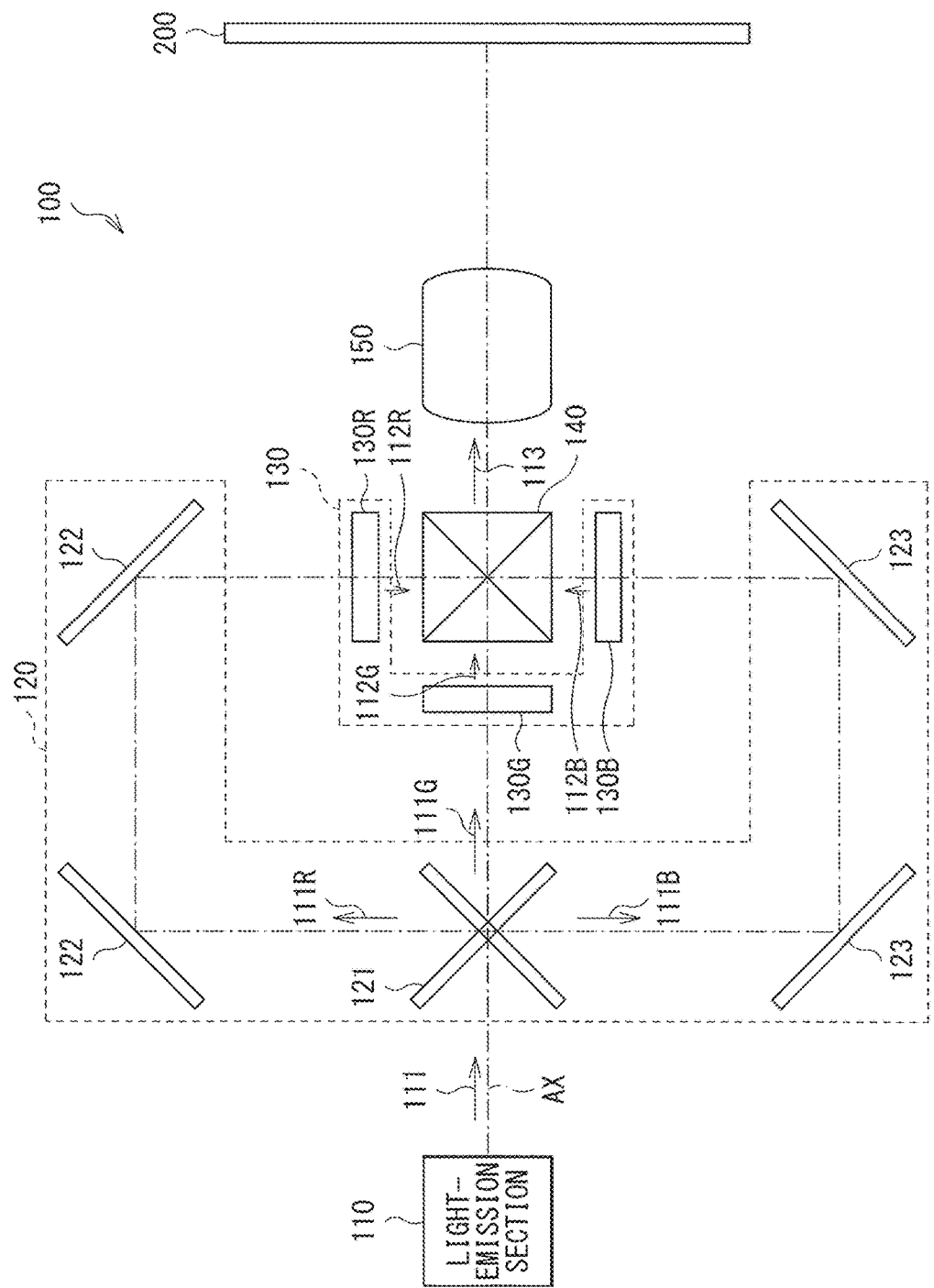

[ FIG. 5 ]
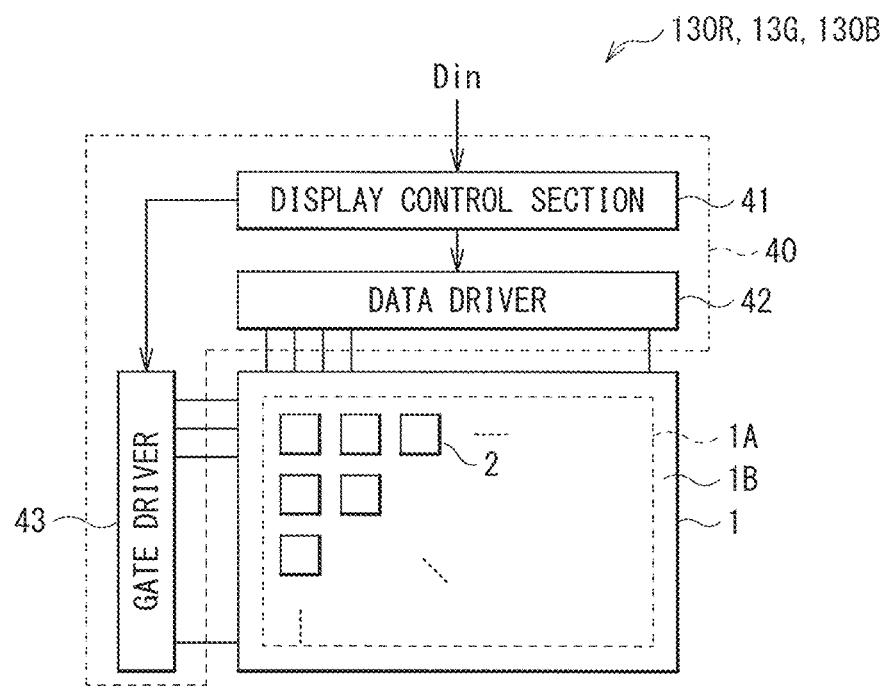
[ FIG. 6 ]
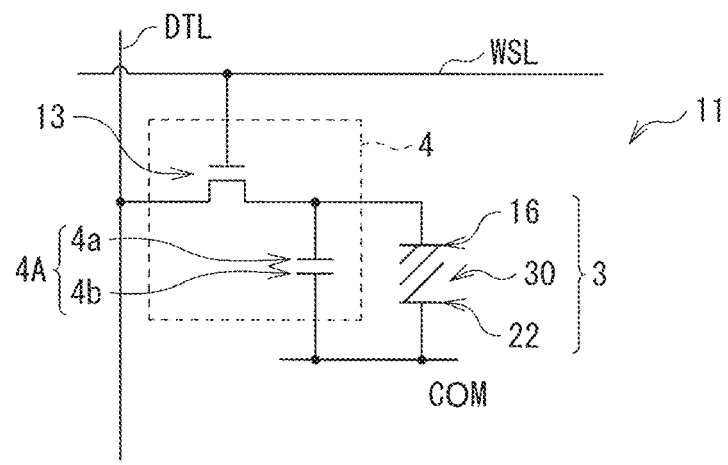

[FIG. 7]
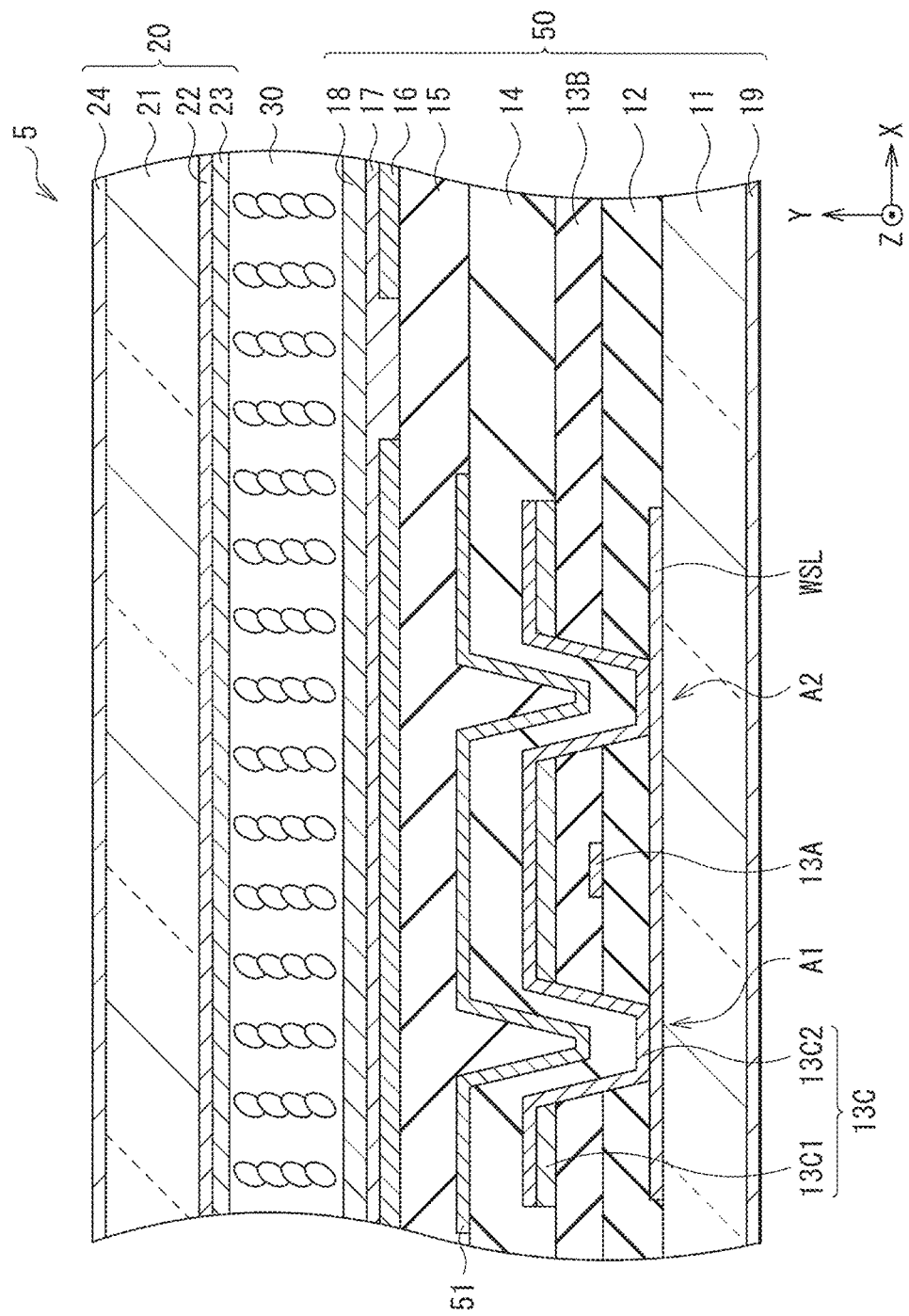

[FIG. 8A]
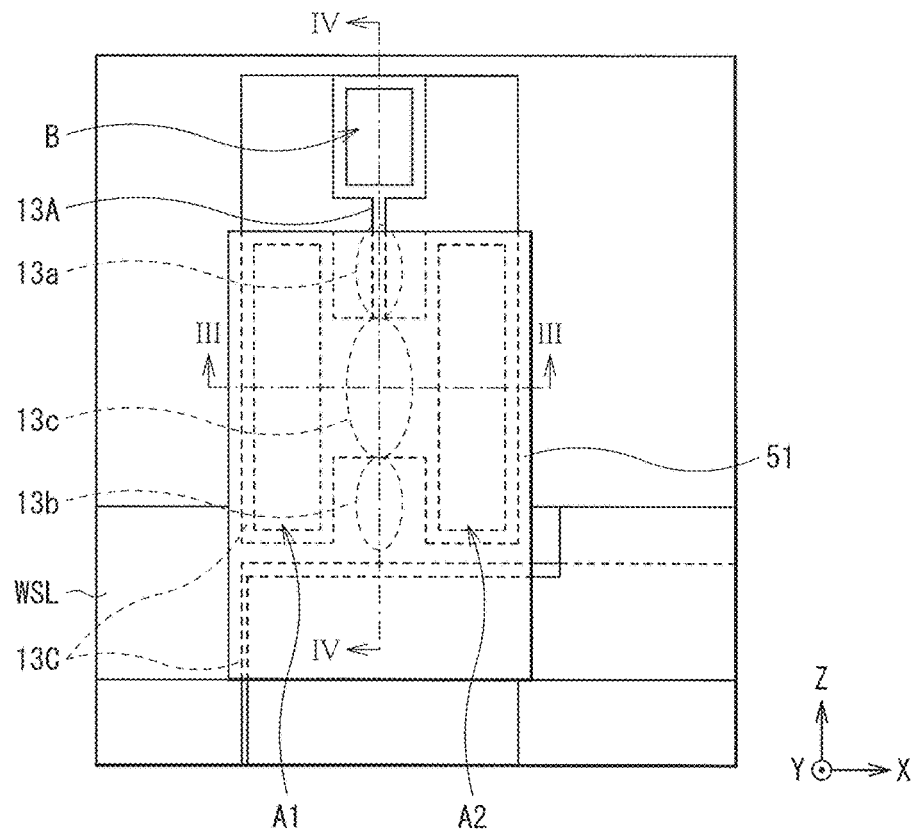
[FIG. 8B]
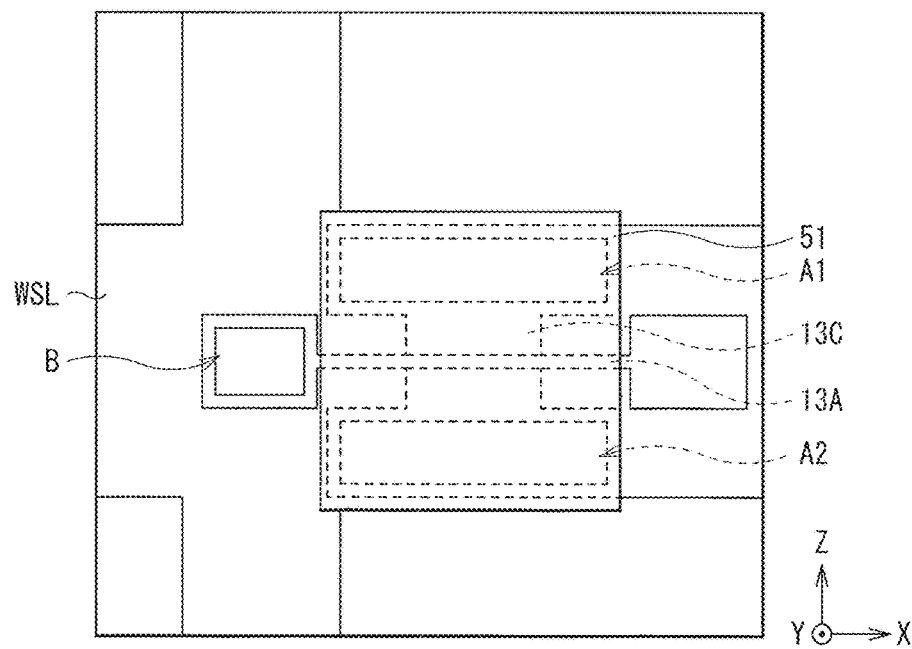

[ FIG. 9 ]
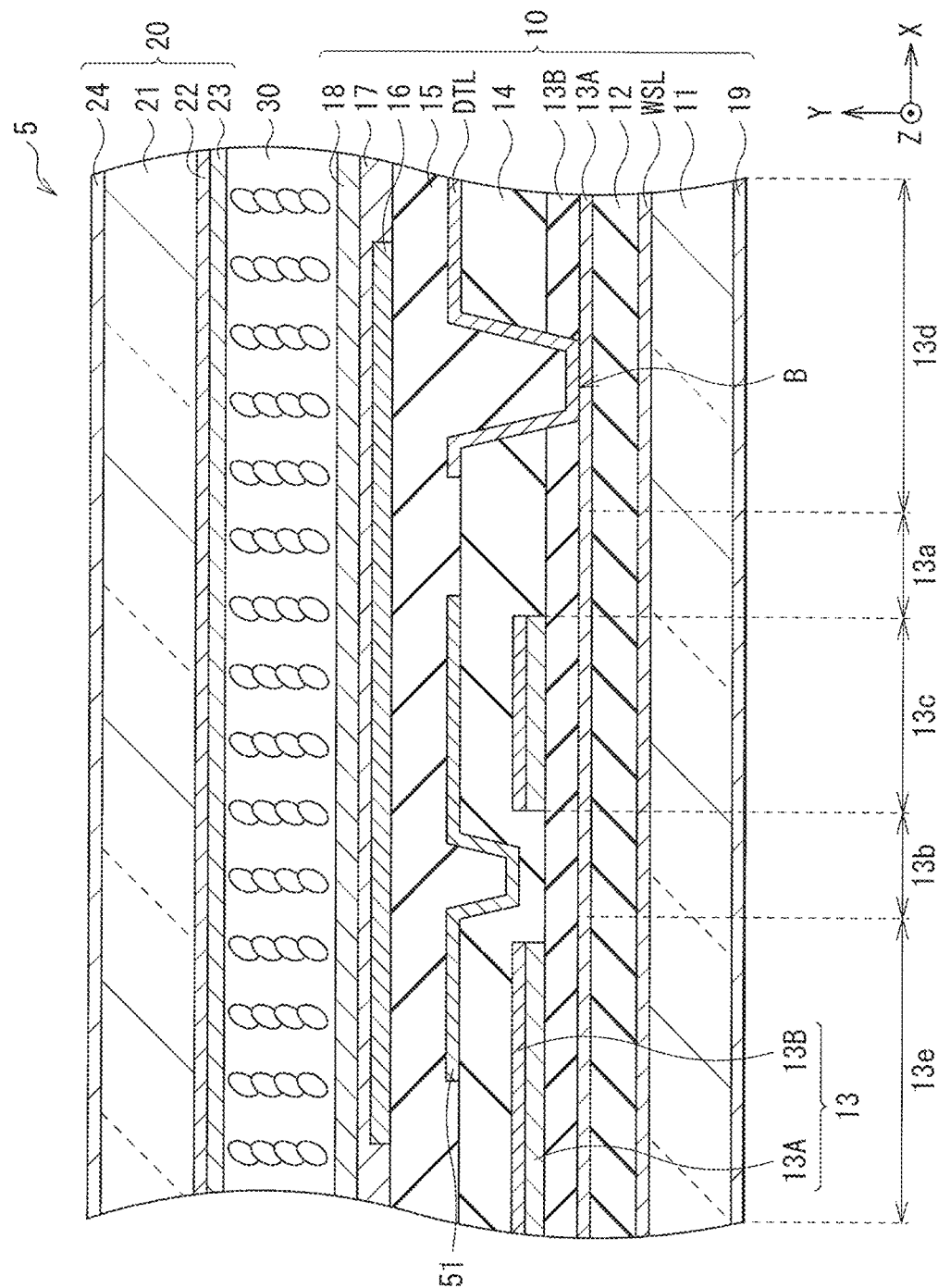

[ FIG. 10 ]
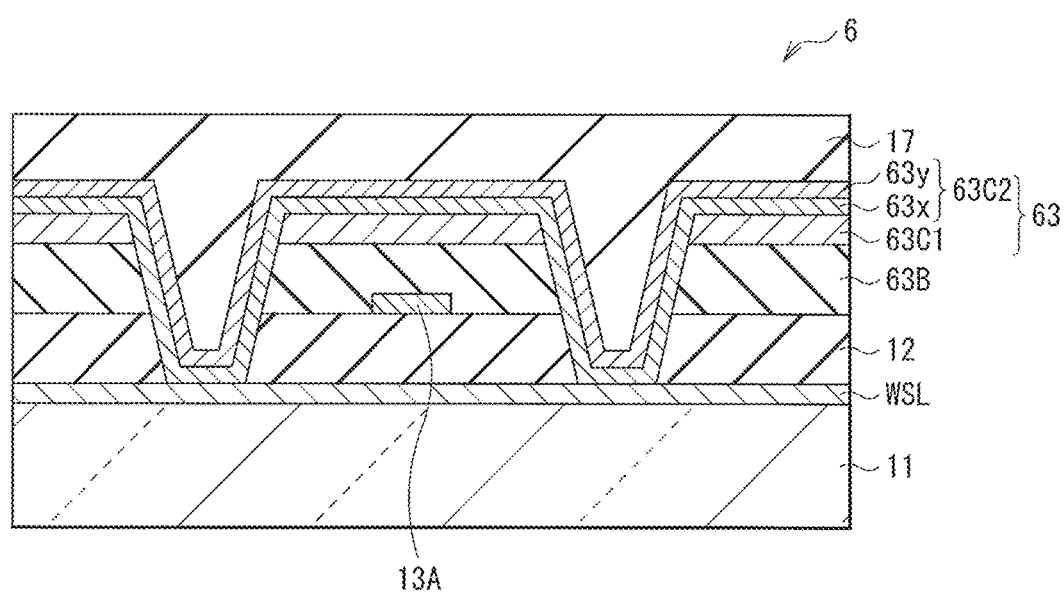

[ FIG. 11 ]
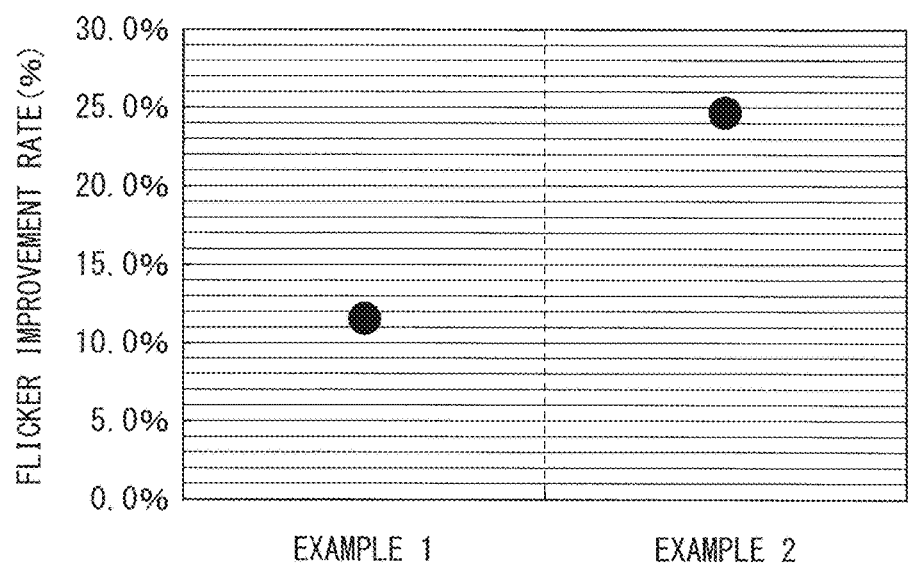
[ FIG. 12 ]
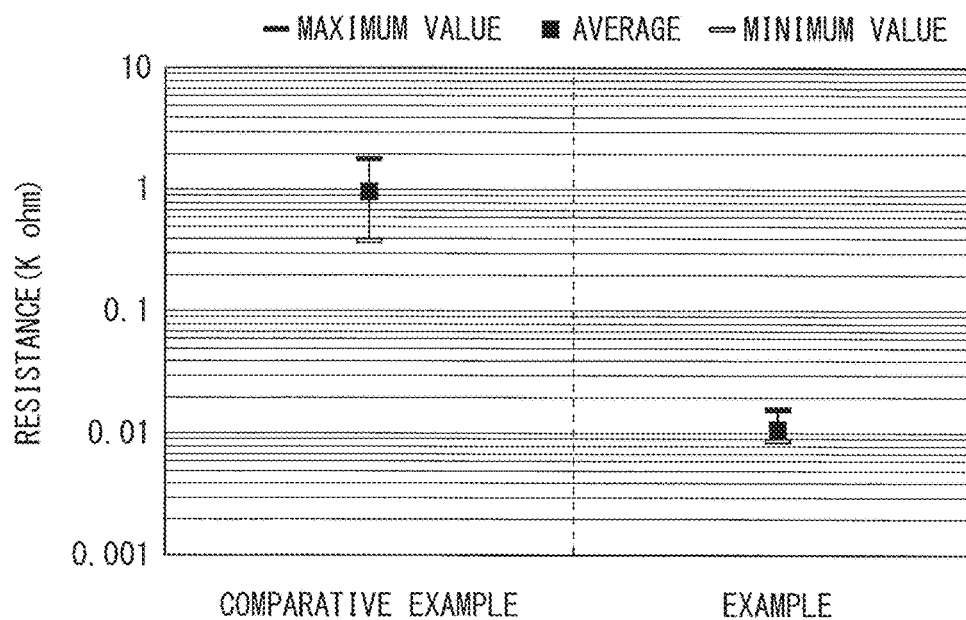

SEMICONDUCTOR DEVICE AND PROJECTION-TYPE DISPLAY UNIT

CROSS REFERENCE TO RELATED APPLICATIONS

This is a U.S. National Stage Application under 35 U.S.C. § 371, based on International Application No. PCT/JP2016/081868, filed Oct. 27, 2016, which claims priority to Japanese Patent Application JP 2015-225702, filed Nov. 18, 2015, each of which is hereby incorporated by reference in its entirety.

TECHNICAL FIELD

The disclosure relates to a semiconductor device including a light-shielding film on a semiconductor layer, and a projection-type display unit including the semiconductor device.

BACKGROUND ART

In recent years, a projection-type liquid crystal display (LCD: Liquid Crystal Display) that projects an image onto a screen has been widely used not only at office but also at home. The projection-type liquid crystal display (a projector) generates image light by modulating light from a light source by using a light valve, and performs display by projecting the image light onto a screen. The light valve includes a liquid crystal panel, and light is modulated by, for example, active matrix driving of each pixel depending on a picture signal from outside. For this reason, improvement of image deficiency (such as flicker and display unevenness) of the liquid crystal panel is desired.

To suppress occurrence of the image deficiency of the liquid crystal panel, it is considerably important to prevent a TFT (Thin Film Transistor) element in a pixel circuit, specifically, a semiconductor layer included in the TFT element, from being irradiated with light. One reason for this is that irradiating the semiconductor layer (in particular, a LDD (Lightly Doped Drain) region) with light generates a light leakage current. For example, PTL 1 discloses a thin-film semiconductor device in which a semiconductor layer and a gate electrode are formed in this order above a scanning line, and the gate electrode and the scanning line are integrated by filling coupling apertures disposed on both sides of a channel region of the semiconductor layer, with the gate electrode, thereby enhancing a light-shielding state for the channel region. Further, PTL 2 discloses a projection-type display unit having a structure in which a semiconductor layer is disposed above a scanning line, and light-shielding films are disposed in a layer above a LDD region of the semiconductor layer with an insulating film interposed therebetween, thereby enhancing a light-shielding performance for the LDD region. Furthermore, PTL 3 discloses an electro-optical unit in which a semiconductor layer and a gate electrode section are formed in this order above a scanning line, and a first electroconductive film extending from the gate electrode section is embedded in contact holes with the scanning line, which are provided on both sides of a LDD region of the semiconductor layer, thereby enhancing a light-shielding property for the channel region. In addition, PTL 3 discloses a structure in which a second electroconductive film extending from a data line is formed above the first electroconductive film with an insulating film interposed therebetween, and this second electroconductive film is embedded in the contact holes with the scanning line, thereby further enhancing the light-shielding property for the channel region.

CITATION LIST

Patent Literature

PTL 1: Japanese Unexamined Patent Application Publication No. 2006-171136
PTL 2: Japanese Unexamined Patent Application Publication No. 2013-57823
PTL 3: Japanese Unexamined Patent Application Publication No. 2012-108407

SUMMARY OF INVENTION

However, structures disclosed in the above-described PTL 1 to PTL 3 have issues such as a low light-shielding performance for light incident from a side into a LDD region, and easy occurrence of film detachment due to low adhesiveness between an insulating film and an electroconductive film as well as a stress difference between films.

It is therefore desirable to provide a semiconductor device and a projection-type display unit which make it possible to improve a light-shielding performance and resistance to film detachment.

A semiconductor device according to an embodiment of the disclosure includes a first substrate; a TFT element provided on the first substrate with a first interlayer insulating layer interposed therebetween, the TFT element including a semiconductor layer and a gate electrode that is provided on the semiconductor layer with a gate insulating layer interposed therebetween; and a second substrate disposed to face the first substrate, in which the gate electrode includes a first electroconductive film and a second electroconductive film that has a light-shielding property in order from side of the semiconductor layer, and the second electroconductive film extends from a side face to a bottom face of each of a pair of openings that are provided to interpose the semiconductor layer.

A projection-type display unit according to an embodiment of the disclosure includes the semiconductor device according to the above-described embodiment and a display layer.

In the semiconductor device and the projection-type display unit according to the respective embodiments of the disclosure, the gate electrode provided on the semiconductor layer with the gate insulating layer interposed therebetween is configured using the first electroconductive film and the second electroconductive film that has the light-shielding property in order from side of the semiconductor layer. This second electroconductive film extends from the side face to the bottom face of each of the pair of openings that are provided to interpose the semiconductor layer. This enhances adhesiveness between the gate electrode including a light-shielding film and the gate insulating layer, and enhances a light-shielding property for the semiconductor layer.

According to the semiconductor device and the projection-type display unit in the respective embodiments of the disclosure, the gate electrode is provided as a laminated film of the first electroconductive film and the second electroconductive film that has the light-shielding property. This allows for enhancement of the adhesiveness between the gate electrode having the light-shielding property and the gate insulating layer. In addition, this second electroconductive film extends from the side face to the bottom face of each of the pair of openings that are formed to interpose the semiconductor layer. The semiconductor layer is provided as an underlayer of the gate electrode with the gate insulating layer interposed therebetween, thus enhancing the light-shielding property for the semiconductor layer. It is therefore possible to enhance a light-shielding performance and resistance to film detachment. It is to be noted that effects described here are not necessarily limitative, and may be any of effects described in the disclosure.

BRIEF DESCRIPTION OF DRAWINGS

FIG. 1 is a cross-sectional view of a liquid crystal panel according to a first embodiment of the disclosure.

FIG. 2A is a schematic plan view of the liquid crystal panel illustrated in FIG. 1.

FIG. 2B is a schematic plan view of a liquid crystal panel serving as another example according to the first embodiment of the disclosure.

FIG. 3 is a cross-sectional view corresponding to a line II-II illustrated in FIG. 2A.

FIG. 4 illustrates an example of a configuration of a display unit according to the first embodiment of the disclosure.

FIG. 5 illustrates an example of a configuration of a space optical modulation section.

FIG. 6 illustrates an example of a circuit configuration of a pixel.

FIG. 7 is a cross-sectional view of a liquid crystal panel serving as an example according to a second embodiment of the disclosure.

FIG. 8A is a schematic plan view of the liquid crystal panel illustrated in FIG. 7.

FIG. 8B is a schematic plan view of the liquid crystal panel according to the second embodiment of the disclosure.

FIG. 9 is a cross-sectional view corresponding to a line IV-IV illustrated in FIG. 8A.

FIG. 10 is a cross-sectional view of a portion of a liquid crystal panel according to a modification example 1 of the disclosure.

FIG. 11 is a characteristic diagram illustrating a flicker improvement rate in Examples 1 and 2 with respect to a comparative example.

FIG. 12 is a characteristic diagram illustrating a comparison of resistance values in a coupling part between a scanning line and a gate electrode.

MODES FOR CARRYING OUT THE INVENTION

Some embodiments of the disclosure are described below in detail with reference to the drawings. It is to be noted that the description is given in the following order.
1. First Embodiment (an example of a liquid crystal projection-type display unit in which a gate electrode includes a first electroconductive film and a second electroconductive film having a light-shielding property, and the second electroconductive film extends to a bottom face of a coupling aperture for a scanning line)
 1-1. Configuration of Liquid Crystal Panel
 1-2. Overall Configuration of Projection-Type Display Unit
 1-3. Workings and Effects
2. Second Embodiment (an example in which an electrically floating light-shielding film is further provided above the gate electrode)
3. Modification Example (an example in which a second electroconductive film is formed as a laminated film)
4. Examples 1. First Embodiment FIG. 1 illustrates a cross-sectional configuration of a liquid crystal panel 1 included in a projection-type display unit (a projector 100, see FIG. 4) according to a first embodiment of the disclosure. The projector 100 includes, for example, components such as the liquid crystal panel 1 illustrated in FIG. 1, and a drive circuit 40 including a display control section 41, a data driver 42, and a gate driver 43, and displays an image on a screen 200 on the basis of a picture signal Din inputted from outside (for each of the components, see FIG. 4 and FIG. 5).
(1-1. Configuration of Liquid Crystal Panel)

FIG. 2A illustrates a planar configuration of the liquid crystal panel 1 illustrated in FIG. 1, and FIG. 1 is a cross-sectional view corresponding to a line I-I in FIG. 2. FIG. 3 illustrates a cross-sectional configuration along a line II-II in FIG. 2A. In the liquid crystal panel 1, a liquid crystal layer 30 is sealed between a drive substrate 10 and a counter substrate 20 disposed to face each other.

In the drive substrate 10, for example, a scanning line WSL is provided on a supporting substrate 11 (on side of the counter substrate 20), and the drive substrate 10 includes a transistor 13, an interlayer insulating layer 14, a planarizing layer 15, a pixel electrode 16, a protective layer 17, and an alignment film 18 in this order with an interlayer insulating layer 12 interposed therebetween. A polarizing plate 19 is disposed on a back surface of the supporting substrate 11. The drive substrate 10 further includes a signal line DTL and a common coupling line COM (unillustrated). The counter substrate 20 includes, for example, a counter electrode 22 and an alignment film 23 on a supporting substrate 21 (on side of the drive substrate 10), and a polarizing plate 24 on a back surface (image-light output surface side) of the supporting substrate 21.

The supporting substrate 11 includes, for example, a glass substrate, and has, for example, a rectangular planar shape (a planar shape parallel to a display screen).

The scanning line WSL is stretched, for example, in an X-axis direction, and extends to be, at least, immediately below a LDD region (a LDD region 13a) of the transistor 13 (a counter region). Specifically, the scanning line WSL extends to be present, for example, immediately below the LDD region 13a, a LDD region 13b, and a channel region 13c (a counter region) and a periphery thereof. The scanning line WSL is configured using a low reflectance material. Specifically, it is preferable to use a low reflectance material such as tungsten silicide (WSi), and a silicide-based semiconductor material having electroconductivity. In addition, low reflectance materials such as tungsten (W), titanium (Ti), molybdenum (Mo), chromium (Cr), tantalum (Ta), and silicide compounds thereof may be used. The scanning line WSL has a film thickness (hereinafter simply referred to as thickness) in a range, for example, from 30 nm to 400 nm, in a Y-axis direction.

The interlayer insulating layers 12 and 14 each include, for example, silicon oxide ($SiO_2$). The interlayer insulating layer 12 covers the scanning line WSL, and is provided over an entire surface of the supporting substrate 11. The transistor 13 is provided on the interlayer insulating layer 12. The interlayer insulating layer 14 is provided to cover a gate insulating layer 13B and a gate electrode 13C of the transistor 13.

The transistor 13 is a TFT element and has a LDD (Lightly Doped Drain) structure. The transistor 13 includes a semiconductor layer 13A, the gate electrode 13C that applies an electric field to the semiconductor layer 13A (in particular, the channel region 13c), and the gate insulating layer 13B that insulates and separates the semiconductor layer 13A and the gate electrode 13C from each other. The transistor 13 further includes the LDD region 13a and the LDD region 13b provided on both sides of the channel region 13c, a source region 13d provided further outward than the LDD region 13a, and a drain region 13e provided further outward than the LDD region 13b. In the transistor 13, the source region 13d is coupled to the signal line DTL, the gate electrode 13C is coupled to the scanning line WSL, and the drain region 13e is coupled to the pixel electrode 16. On both sides of the semiconductor layer 13A stretched in the X-axis direction, a pair of openings A1 and A2 passing through the gate insulating layer 13B and the interlayer insulating layer 12 are provided. The openings A1 and A2 are coupling apertures for electrical coupling between the gate electrode 13C and the scanning line WSL. It is sufficient that the openings A1 and A2 be each provided at least at positions corresponding to the channel region 13c and the LDD region 13b of the semiconductor layer 13A; in this example, the openings A1 and A2 are each provided from the LDD region 13a to the LDD region 13b.

It is sufficient that the openings A1 and A2 be arranged in parallel with the semiconductor layer 13A as in the foregoing embodiment. In other words, the openings A1 and A2 may be formed in parallel with the scanning line WSL extending in a Z-axis direction as illustrated in FIG. 2A, or may be formed in parallel with the scanning line WSL extending in the X-axis direction as illustrated in FIG. 2B.

The channel region 13c, the LDD regions 13a and 13b, the source region 13d, and the drain region 13e are all formed, for example, in the same layer, and include, for example, a material such as amorphous silicon and polycrystalline silicon. The source region 13d and the drain region 13e are, for example, doped with an impurity such as an n-type impurity to have low resistance. The LDD regions 13a and 13b are doped with an impurity to have an impurity concentration lower than that of each of the source region 13d and the drain region 13e.

The gate insulating layer 13B is provided to insulate the semiconductor layer 13A and the gate electrode 13C electrically. The gate insulating layer 13B includes, for example, a material such as silicon oxide and silicon nitride ($Si_3O_4$), and is formed by, for example, a thermal oxidation method or a CVD (Chemical Vapor Deposition) method.

The gate electrode 13C is provided to straddle the semiconductor layer 13A in the X-axis direction with the gate insulating layer 13B interposed therebetween. In the semiconductor layer 13A, a region facing the gate electrode 13C serves as the channel region 13c. In the present embodiment, the gate electrode 13C has a layered structure in which a first electroconductive film 13C1 and a second electroconductive film 13C2 having a light-shielding property are stacked in this order. The first electroconductive film 13C1 is formed by, for example, a material having electroconductivity such as poly-silicon and amorphous silicon, and, for example, an impurity such as phosphorus (P) is added thereto. Preferably, the first electroconductive film 13C1 has a thickness of, for example, 40 nm or more. An upper limit is, for example, 1 um or less. The second electroconductive film 13C2 is formed by a material having low reflectivity (a low refractive index property) and electroconductivity, and has, preferably, for example, a thickness in a range from 30 nm to 400 nm. Specifically, for example, in a case where the openings A1 and A2 each have a minor axis (e.g., a width of a bottom face in the X-axis direction in FIG. 2A) of 0.7 μm, the second electroconductive film 13C2 desirably has a thickness of 0.35 μm or less. Examples of specific materials of the second electroconductive film 13C2 include low reflectance materials such as W, Ti, Mo, Cr, Ta, and silicide compounds thereof. The second electroconductive film 13C2 is formed using one or two or more of these materials. In this way, the gate electrode 13C has the layered structure of the first electroconductive film 13C1 and the second electroconductive film 13C2, and the first electroconductive film 13C1 is formed between the gate insulating layer 13B and the second electroconductive film 13C2, thereby ensuring adhesiveness of the second electroconductive film 13C2 to the gate insulating layer 13B.

The gate electrode 13C straddling the semiconductor layer 13A in the X-axis direction extends at least to the bottom face of each of the above-described openings A1 and A2, and electrically coupled to the scanning line WSL at the bottom face of each of the openings A1 and A2. It is sufficient that the layered structure of the first electroconductive film 13C1 and the second electroconductive film 13C2 of the gate electrode 13C be provided at least on the gate insulating layer 13B, and that the second electroconductive film 13C2 extend in the openings A1 and A2, as illustrated in FIG. 1. The second electroconductive film 13C2 formed by the low reflectance material and the scanning line WSL are electrically coupled to each other at the bottom face of each of the openings A1 and A2, thereby efficiently suppressing incidence of light of an oblique component into the channel region 13c and the LDD region 13b of the semiconductor layer 13A. It is to be noted that not only the second electroconductive film 13C2 but also the first electroconductive film 13C1 may extend inside the openings A1 and A2.

The layered structure of the gate electrode 13C and the structure of the openings A1 and A2 of the present embodiment are formed using, for example, the following procedure. The gate insulating layer 13B and the first electroconductive film 13C1 are formed on the supporting substrate 11, and then, for example, the openings A1 and A2 that penetrate up to the scanning line WSL are formed by, for example, dry etching. Next, the second electroconductive film 13C2 is formed using a CVD method. This forms the gate electrode 13C having the layered structure of the first electroconductive film 13C1 and the second electroconductive film 13C2 on the gate insulating layer 13B, and having only the second electroconductive film 13C2 formed in the openings A1 and A2.

It is to be noted that FIG. 1 illustrates an example in which a side face and the bottom face of each of the openings A1 and A2 are covered with the second electroconductive film 13C2, but the openings A1 and A2 may be completely filled with the second electroconductive film 13C2.

For example, the signal line DTL is stretched, for example, in the Y-axis direction, and is provided, for example, immediately above (a counter region) the semiconductor layer 13A on the interlayer insulating layer 14. The signal line DTL is electrically coupled to the semiconductor layer 13A in an opening B that penetrates the interlayer insulating layer 14 and the gate insulating layer 13B in the source region 13d of the semiconductor layer 13A. The signal line DTL is configured, for example, as a laminated film that includes a tungsten silicide film and a metal film such as aluminum (Al), Ti, and copper (Cu). The signal line DTL has a thickness in a range, for example, from 100 nm to 1 μm.

The planarizing layer 15 is almost uniformly formed on the interlayer insulating layer 14. The planarizing layer 15 includes, for example, epoxy resin or acrylic resin.

The pixel electrode 16 is provided for each pixel (a pixel 2), and includes, for example, a transparent electroconductive film. For the transparence electroconductive film, for example, an oxide semiconductor called indium tin oxide (ITO), indium zinc oxide (IZO), zinc oxide (ZnO), or IGZO (indium-gallium-zinc-containing oxide) is used.

The protective layer 17 is formed to suppress corrosion of the pixel electrode 16. This protective layer 17 includes, for example, an inorganic material such as silicon oxide and silicon nitride, which is chemically more stable than a material that forms the alignment films 18 and 23. The protective layer 17 has a thickness of, for example, 30 nm to 70 nm. This protective layer 17 is formed to cover at least a pixel section 1A. It is preferable that the protective layer 17 be formed by, for example, a technique chemically more stable than a vapor deposition method, such as a CVD method and a sputtering method.

The alignment film 18 is provided to perform orientation control of the liquid crystal layer 30, and includes, for example, an inorganic material such as silicon oxide. The alignment film 18 has a thickness of, for example, about 120 nm to about 360 nm. The alignment film 18 is formed, for example, by a vapor deposition method. The alignment film 18 is formed to cover the pixel electrode 16 and, for example, formed from the pixel section 1A to a peripheral section 1B. The alignment film 18 includes a film formation region having, for example, a rectangular planar shape that is substantially identical to that of the supporting substrate 11. It is to be noted that the alignment film 23 also has a similar configuration.

The supporting substrate 21 includes, for example, a glass substrate. The supporting substrate 21 is provided with, for example, a color filter and a light-shielding layer (a black matrix layer) that are unillustrated, and these are covered with, for example, an overcoat film. The counter electrode 22 is provided on this overcoat film.

The counter electrode 22 is, for example, an electrode common to each of the pixels, and supplies an image voltage to the liquid crystal layer 30 together with the pixel electrode 16. The counter electrode 22 includes, for example, the above-described transparent electroconductive material, as with the pixel electrode 16.

The liquid crystal layer 30 has a function of controlling transmittance of light transmitted therethrough, depending on the image voltage supplied through the pixel electrode 16 and the counter electrode 22. This liquid crystal layer 30 includes, for example, a liquid crystal to be subjected to display driving in modes such as a VA (Vertical Alignment) mode, a TN (Twisted Nematic) mode, an ECB (Electrically controlled birefringence) mode, a FFS (Fringe Field Switching) mode, and an IPS (In Plane Switching) mode. The liquid crystal layer 30 is not limited in particular in terms of a liquid crystal material, as described above, but the liquid crystal material is effective, in particular, in a case where orientation control is performed using an inorganic alignment film as with the alignment films 18 and 23 described later.

The polarizing plates 19 and 24 are, for example, in a crossed Nichol arrangement, and allow only light in a certain constant vibration direction (polarized light) to pass therethrough.

(1-2. Overall Configuration of Projection-Type Display Unit)

FIG. 4 illustrates an example of an overall configuration of the projector 100. The projector 100 is, for example, a three-panel transmission-type projector, and includes, for example, a light-emission section 110, an optical-path branching section 120, a space optical modulation section 130, a combining section 140, and a projection section 150.

The light-emission section 110 supplies a light flux to irradiate an irradiated surface of the space optical modulation section 130, and includes, for example, a lamp serving as a white light source and a reflecting mirror formed behind the lamp. This light-emission section 110 may include some kind of optical element on an as-needed basis, in a region (on an optical axis AX) through which light 111 of the lamp passes. For example, it is possible to provide a filter that dims light except for visible light among the light 111 from the lamp, and an optical integrator that makes an illuminance distribution uniform on the irradiated surface of the space optical modulation section 130, in order from side of the lamp, on the optical axis AX of the lamp.

The optical-path branching section 120 separates the light 111 outputted from the light-emission section 110 into a plurality of color beams in wavebands different from each other, and guides each of the color beams to the irradiated surface of the space optical modulation section 130. As illustrated in FIG. 4, the optical-path branching section 120 includes, for example, a cross mirror 121, two mirrors 122, and two mirrors 123. The cross mirror 121 separates the light 111 outputted from the light-emission section 110 into a plurality of color beams in wavebands different from each other, and branches an optical path for each of the color beams. The cross mirror 121 is disposed, for example, on the optical axis AX, and is configured by linking two mirrors different from each other in wavelength-selectivity to intersect each other. The mirrors 122 and 123 reflect the color beams (in FIG. 4, red light 111R and blue light 111B) for which the optical path is branched by the cross mirror 121, and are disposed at respective places different from the optical axis AX. The mirror 122 is disposed to guide the light (in FIG. 4, the red light 111R) reflected in one direction intersecting the optical axis AX by one mirror included in the cross mirror 121 to an irradiated surface of a space optical modulation section 130R. The mirror 123 is disposed to guide the light (in FIG. 4, the blue light 111B) reflected in another direction intersecting the optical axis AX by another mirror included in the cross mirror 121 to an irradiated surface of a space optical modulation section 130B. Of the light 111 outputted from the light-emission section 110, the light (in FIG. 4, green light 111G) having been transmitted through the cross mirror 121 to pass on the optical axis AX is incident on an irradiated surface of a space optical modulation section 130G disposed on the optical axis AX.

The space optical modulation section 130 modulates a plurality of color beams for each of the color beams depending on the picture signal Din inputted from an unillustrated information processor, and thereby generates the modulated light for each of the color beams. This space optical modulation section 130 includes, for example, the space optical modulation section 130R that modulates the red light 111R, the space optical modulation section 130G that modulates the green light 111G, and the space optical modulation section 130B that modulates the blue light 111B.

The space optical modulation section 130R is disposed in a region facing one surface of the combining section 140. This space optical modulation section 130R generates red image light 112R by modulating the incident red light 111R on the basis of the picture signal Din, and outputs this red image light 112R to the surface, which is behind the space optical modulation section 130R, of the combining section 140. The space optical modulation section 130G is disposed in a region facing another surface of the combining section 140. This space optical modulation section 130G generates green image light 112G by modulating the incident green light 111G on the basis of the picture signal Din, and outputs this green image light 112G to the surface, which is behind the space optical modulation section 130R, of the combining section 140. The space optical modulation section 130B is disposed in a region facing still another surface of the combining section 140. This space optical modulation section 130B generates blue image light 112B by modulating the incident blue light 111B on the basis of the picture signal Din, and outputs this blue image light 112B to the surface, which is behind the space optical modulation section 130R, of the combining section 140.

The combining section 140 generates image light by combining a plurality of beams of the modulated light. This combining section 140 is, for example, a cross prism disposed, for example, on the optical axis AX, and configured by bonding four prisms. For example, due to a film such as a multilayer interference film, two selective reflecting surfaces different from each other in wavelength-selectivity are formed at bonding surfaces of these prisms. One of the selective reflecting surfaces reflects, for example, the red image light 112R outputted from the space optical modulation section 130R in a direction parallel to the optical axis AX, and guides the reflected light in a direction toward the projection section 150. Further, the other of the selective reflecting surfaces reflects, for example, the blue image light 112B outputted from the space optical modulation section 130B in a direction parallel to the optical axis AX, and guides the reflected light in a direction toward the projection section 150. Furthermore, the green image light 112G outputted from the space optical modulation section 130G is transmitted through the two selective reflecting surfaces, and travels in a direction toward the projection section 150. Eventually, the combining section 140 generates image light 113 by combining beams of the image light generated by each of the space optical modulation sections 130R, 130G, and 130B, and outputs the generated image light 113 to the projection section 150.

The projection section 150 projects the image light 113 outputted from the combining section 140 onto the screen 200 to thereby display an image. This projection section 150 is, for example, disposed on the optical axis AX, and includes a projection lens, for example.

FIG. 5 illustrates an example of an overall configuration of each of the space optical modulation sections 130R, 130G, and 130B in FIG. 4. The space optical modulation sections 130R, 130G, and 130B each include, for example, the above-described liquid crystal panel 1, and the drive circuit 40 that drives the liquid crystal panel 1. The drive circuit 40 includes the display control section 41, the data driver 42, and the gate driver 43.

The liquid crystal panel 1 includes the pixel section 1A in which a plurality of pixels 2 are formed in matrix, and the peripheral section 1B thereof. The liquid crystal panel 1 displays an image based on the picture signal Din inputted from outside, by performing active driving of each of the pixels 2 through use of the data driver 42 and the gate driver 43.

The liquid crystal panel 1 includes a plurality of scanning lines WSL extending in a row direction, a plurality of signal lines DTL extending in a column direction, and a plurality of common coupling lines COM extending in the row direction. The pixel 2 is provided to correspond to an intersection part of the signal line DTL and the scanning line WSL. Each of the signal lines DTL is coupled to an output end (unillustrated) of the data driver 42. Each of the scanning lines WSL is coupled to an output end (unillustrated) of the gate driver 43. Each of the common coupling lines COM is coupled to, for example, an output end (unillustrated) of a circuit that outputs a fixed electric potential.

The display control section 41 stores and holds, for example, the supplied picture signal Din in a frame memory for each screen (for each display of one frame). The display control section 41 also has, for example, a function of controlling the data driver 42 and the gate driver 43 that drive the liquid crystal panel 1 to operate in coordination with each other. Specifically, for example, the display control section 41 supplies a scanning timing control signal to the data driver 42, and supplies an image signal for one horizontal line based on an image signal held in the frame memory and a display timing control signal to the data driver 42.

The data driver 42 supplies, as a signal voltage, for example, the picture signal Din for one horizontal line supplied from the display control section 41 to each of the pixels 2. Specifically, for example, the data driver 42 supplies a signal voltage corresponding to the picture signal Din to each of the pixels 2 that configure one horizontal line selected by the gate driver 43, through the signal line DTL.

The gate driver 43 has, for example, a function of selecting the pixel 2 to be driven, depending on the scanning timing control signal supplied from the display control section 41. Specifically, for example, the gate driver 43 selects, as a target to be driven, one row of the pixels 2 formed in matrix in the pixel section 1A, by applying a selection pulse to the gate electrode 13C of the transistor 13 of the pixel 2 through the scanning line WSL. Then, in these pixels 2, display of one horizontal line is performed depending on a signal voltage supplied from the data driver 42. In this way, the gate driver 43 performs, for example, sequential scanning for each horizontal line time-divisionally, and thereby performs display for an entire display region.

Next, a circuit configuration of the pixel 2 is described. FIG. 6 illustrates an example of the circuit configuration of the pixel 2. The pixel 2 includes a liquid crystal element 3, and a pixel circuit 4 that drives the liquid crystal element 3. The liquid crystal element 3 and the pixel circuit 4 are provided to correspond to the intersection part of the scanning line WSL and the signal line DTL. The liquid crystal element 3 includes a liquid crystal cell (the liquid crystal layer 30), as well as the pixel electrode 16 and the counter electrode 22 that interpose the liquid crystal layer 30. In other words, the cross-sectional view of the liquid crystal panel 1 illustrated in each of FIG. 1 and FIG. 3 corresponds to the intersection part of the scanning line WSL and the signal line DTL. The pixel circuit 4 includes the transistor 13 that writes a signal voltage into the liquid crystal element 3, and a storage capacitance 4A that holds the voltage written into the liquid crystal element 3. The storage capacitance 4A is provided to prevent a leakage of a signal voltage held between the pixel electrode 16 and the counter electrode 22, and includes a pair of capacitance electrodes 4a and 4b facing each other with a predetermined clearance therebetween. The capacitance electrode 4a is coupled to the drain region 13e of the semiconductor layer 13A, and the capacitance electrode 4b is coupled to the common coupling line COM.

(1-3. Workings and Effects)

As described above, to suppress occurrence of an image deficiency of a liquid crystal panel, it is considerably important to prevent a semiconductor layer of a TFT element included in a pixel circuit from being irradiated with light. For this reason, various structures with an enhanced light-shielding performance for the semiconductor layer are proposed. In a first structure, a semiconductor layer and a gate electrode are formed in this order above a scanning line, and the gate electrode and the scanning line are integrated by filling coupling apertures disposed on both sides of the channel region of the semiconductor layer, with the gate electrode. In a second structure, light-shielding films are disposed in a layer above a LDD region of the semiconductor layer with an insulating film interposed therebetween, thereby enhancing a light-shielding performance for the LDD region. In a third structure, a gate electrode includes a material having a light-shielding property, and this gate electrode extends in contact holes for a scanning line provided on both sides of a LDD region of a semiconductor layer, or a light-shielding film is further disposed on the gate electrode.

However, the above-described structures each have issues. First, in the first structure, a polysilicon film used as a light-shielding film is inferior to a silicide film and an aluminum film in terms of the light-shielding performance, and resistance is high because of oxidation of the polysilicon film at a bottom face part of the coupling aperture due to work in a high temperature furnace during film formation. Further, in the second structure, the light-shielding performance is not sufficient for incidence of light from a side face of the LDD region. Furthermore, in the third structure, an electroconductive film may be detached due to insufficient adhesiveness between the electroconductive film (such as a silicide film and an aluminum film) and an insulating oxide film or due to a stress of each film, and moreover, a material is limited because of attenuation of a threshold voltage (Vth) by the electroconductive film near the LDD region, from the view point of a work function.

In contrast, in the present embodiment, the gate electrode 13C is formed to have the layered structure in which the second electroconductive film 13C2 having the light-shielding property is formed on the first electroconductive film 13C1, and further, the second electroconductive film 13C2 extends up to the bottom face of each of the pair of openings A1 and A2 provided on both sides of the semiconductor layer 13A. This enhances adhesiveness between the gate insulating layer 13B and the gate electrode 13C having the light-shielding property. The gate insulating layer 13B is provided between the semiconductor layer 13A and the gate electrode 13C. In addition, incidence of light of an oblique component into the semiconductor layer 13A is suppressed.

In view of the foregoing, in the projection-type display unit (the projector 100) of the present embodiment, the gate electrode 13C of the transistor 13 provided in the drive substrate 10 of the liquid crystal panel 1 is provided as the laminated film including the first electroconductive film 13C1 and the second electroconductive film 13C2 having the light-shielding property. This makes it possible to enhance adhesiveness between the gate electrode 13C having the light-shielding property and the gate insulating layer 13B, and to enhance resistance to film detachment. Further, the second electroconductive film 13C2 having the light-shielding property extends from the side face to the bottom face of each of the pair of openings A1 and A2 provided to interpose the semiconductor layer 13A. This suppresses incidence of light of an oblique component into the semiconductor layer 13A. It is therefore possible to enhance the light-shielding performance for the semiconductor layer 13A. Accordingly, it is possible to prevent generation of a light leakage current, and to provide a projection-type display unit with high display properties and with an enhanced production yield.

Further, it is possible to suppress incidence of light (stray light) of an oblique component into the semiconductor layer 13A, by forming the scanning line WSL using a material (a low reflectance material) having a light-shielding property, and by electrically coupling this scanning line WSL and the second electroconductive film 13C2 having the light-shielding property at the bottom face of each of the openings A1 and A2.

It is to be noted that the openings A1 and A2 provided at the positions corresponding to the semiconductor layer 13A may not necessarily provided on both sides, and may be provided on either one side; alternatively, the second electroconductive film 13C2 may extend on this one side. This allows for achievement of a certain amount of enhancement of the light-shielding performance, although the light-shielding property for the semiconductor layer 13A may be inferior as compared with the case where the openings A1 and A2 are provided on both sides of the semiconductor layer 13A and the second electroconductive film 13C2 extends up to the bottom face of each of the openings A1 and A2.

A second embodiment of the disclosure and a modification example thereof are described below. It is to be noted that the same components as those of the foregoing first embodiment are denoted by the same reference numerals, and the descriptions thereof are omitted.

2. Second Embodiment

FIG. 7 illustrates a cross-sectional configuration of a liquid crystal panel 5 included in the projection-type display unit (the projector 100) according to the second embodiment of the disclosure. FIG. 8A illustrates a planar configuration of the liquid crystal panel 1 illustrated in FIG. 7, and FIG. 7 is a cross-sectional view corresponding to a line III-III in FIG. 8A. FIG. 9 illustrates a cross-sectional configuration along a line IV-IV in FIG. 8A. The liquid crystal panel 5 of the present embodiment is different from the foregoing first embodiment in that an electrically floating light-shielding film 51 is formed on the transistor 13.

The light-shielding film 51 is provided, for example, on the same layer as the above-described the signal line DTL, e.g., on the interlayer insulating layer 14, and is formed to be electrically floating. For example, the light-shielding film 51 is provided, for example, for each of the pixel circuits 4. It is to be noted that the light-shielding film 51 may be provided for each of the plurality of pixel circuits 4, or may be provided, for example, for each pixel row. Specifically, it is sufficient that the light-shielding film 51 be formed at least immediately above (a counter region) the LDD region 13b of the semiconductor layer 13A: preferably, for example, the light-shielding film 51 covers the pair of openings A1 and A2 provided on both sides of the semiconductor layer 13A from the LDD regions 13a and 13b as well as the channel region 13c of the semiconductor layer 13A. Preferably, the light-shielding film 51 on the openings A1 and A2 is formed along shapes of the openings A1 and A2, together with the interlayer insulating layer 14. This allows the film having the light-shielding property and formed on a side face of each of the LDD regions 13a and 13b as well as the channel region 13c of the semiconductor layer 13A to be provided as a double-layer film (the second electroconductive film 13C2 and the light-shielding film 51), thereby further suppressing incidence of light of an oblique component.

Examples of a material of the light-shielding film 51 include low reflectance materials such as W, Ti, Mo, Cr, Ta, and silicide compounds thereof, as with the second electroconductive film 13C2 of the gate electrode 13C described above. The light-shielding film 51 is formed using one or two or more of these materials. Preferably, the light-shielding film 51 has a thickness in a range, for example, from 30 nm to 1 μm. In particular, as described above, in order to fill the openings A1 and A2 with the light-shielding film 51, it is preferable that at least a total film thickness of the second electroconductive film 13C2, the interlayer insulating layer 14, and the light-shielding film 51 be smaller than a minor axis of each of the openings A1 and A2 (e.g., width of the bottom face in the X-axis direction in FIG. 8A). For example, in a case where the minor axis of each of the openings A1 and A2 is 0.7 μm, the above-described total film thickness of the three layers is desirably 0.35 μm or less.

It is sufficient that the openings A1 and A2 be arranged in parallel with the semiconductor layer 13A as in the foregoing first embodiment. In other words, the openings A1 and A2 may be formed in parallel with the scanning line WSL extending in the Z-axis direction as illustrated in FIG. 8A, or may be formed in parallel with the scanning line WSL stretched in the X-axis direction as illustrated in FIG. 8B.

As described above, in the present embodiment of the present embodiment, the electrically floating light-shielding film 51 is provided on the transistor 13 of the liquid crystal panel 5 used in the projection-type display unit (the projector 100). Specifically, the light-shielding film 51 is provided immediately above (the counter region) the LDD region 13b of the semiconductor layer 13A. It is therefore possible to prevent incidence of light from above (light incident from side of the counter substrate 20) into the LDD regions 13a and 13b as well as the channel region 13c. Hence, it is possible to further improve the light-shielding performance in the foregoing embodiment.

Moreover, it is possible to further enhance the light-shielding property for the light of the oblique component, by providing the light-shielding film 51 to cover the pair of openings A1 and A2 provided on both sides of the semiconductor layer 13A from the LDD regions 13a and 13b as well as the channel region 13c of the semiconductor layer 13A.

3. Modification Example

FIG. 10 illustrates a portion of a cross-sectional configuration of a liquid crystal panel 6 included in a projection-type display unit (the projector 100) according to a modification example of the disclosure. In the present modification example, a gate electrode 63C has a layered structure of a first electroconductive film 63C1 and a second electroconductive film 63C2 as with the foregoing first and second embodiments. The present modification example is different from the foregoing first and second embodiments in that the second electroconductive film 63C2 is formed as a multilayer film (in this example, two layers of 63x and 63y) that includes materials different from each other.

As described above, the gate electrode 63C has a structure in which the first electroconductive film 63C1 and the second electroconductive film 63C2 are stacked in order from side of the supporting substrate 11, and moreover, the second electroconductive film 63C2 is formed as the multilayer film (the second electroconductive films 63x and 63y in order from side of the first electroconductive film 63C1). It is preferable that the second electroconductive films 63x and 63y be formed using, for example, materials of transmission wavelength regions different from each other. Examples of the material of the second electroconductive film 63x include Ti and Mo, as well as oxide, nitride, and silicide films thereof. Examples of the material of the second electroconductive film 63y include W, as well as nitride and silicide films thereof. Preferably, the second electroconductive film 63x and the second electroconductive film 63y each have a thickness in a range from 30 nm to 400 nm, and desirably, the second electroconductive film 63x and the second electroconductive film 63y combined are smaller than the minor axis of each of the openings A1 and A2 as in the foregoing second embodiment.

As described above, in addition to the effect of the foregoing first embodiment, it is possible to enhance the light-shielding performance further by forming the second electroconductive film 63C2 having the light-shielding property as the laminated film. One reason for this is that it is possible to interrupt stray light through a grain boundary or pinhole that may be formed in the second electroconductive film 63C2. Further, an effect is achieved that makes it possible to ensure the light-shielding property for light of a wider wavelength region, by forming the second electroconductive films 63x and 63y through use of materials of different transmission wavelengths, for example.

It is to be noted that the configuration of the second electroconductive film 63C2 of the present modification example is also applicable to the foregoing second embodiment. Combining the second embodiment and the present modification example suppresses light propagation inside the insulating layer (the interlayer insulating layers 12 and 14 as well as the gate insulating layer 13B) below the light-shielding film 51, thereby achieving an effect of obtaining a higher light-shielding performance.

4. Examples

FIG. 11 illustrates a flicker improvement rate in each of Examples 1 and 2 with respect to a comparative example when a liquid crystal panel according to each of Examples (Examples 1 and 2) and the comparative example is irradiated with light. The liquid crystal panel according to Example 1 corresponds to the first embodiment in which the second electroconductive film 13C2 having the light-shielding property is formed from the side face to the bottom face of each of the openings A1 and A2. The liquid crystal panel according to Example 2 corresponds to the second embodiment in which the electrically floating light-shielding film 51 is further provided on the semiconductor layer 13A. The liquid crystal panel according to the comparative example is a typical liquid crystal panel in which only a polysilicon film (corresponding to the first electroconductive film of the disclosure) is formed inside the openings A1 and A2.

As appreciated from FIG. 11, the improvement rate of Example 1 was 11.7%, and the improvement rate of Example 2 was 24.7%, with respect to the comparative example. It is therefore confirmed that in the liquid crystal panel of the disclosure, as compared with the typical liquid crystal panel, incidence of light (stray light) of an oblique component into the channel region and the LDD region in proximity thereto was prevented, and generation of a light leakage current was suppressed. Further, it was found that a higher light-shielding property was obtained by forming the electrically floating light-shielding film 51 on the semiconductor layer 13A.

FIG. 12 illustrates a measured resistance value of the coupling part between the scanning line and the gate electrode inside the openings A1 and A2 of each of the foregoing comparative example and Example 1. In the comparative example in which the polysilicon film and the scanning line are electrically coupled inside the openings A1 and A2, the resistance value was about 0.98 Kohm. In contrast, in Example 1 in which the second electroconductive film 13C2 having the light-shielding property and the scanning line WSL are electrically coupled inside the openings A1 and A2, the resistance value was 0.01 Kohm, i.e., the resistance was reduced to about 1/100. One conceivable reason for this is that, in the comparative example, an oxide film was formed in high-temperature furnace work during formation of the polysilicon film. For the formation of the second electroconductive film 13C2 (e.g., a WSi film) having the light-shielding property used in Example 1, high-temperature furnace work is unnecessary, and thus no oxide film is formed.

In view of the foregoing, it is found that the gate electrode 13C having the layered structure of the first electroconductive film 13C1 that includes a material such as poly-silicon and the second electroconductive film 13C2 having the light-shielding property as well as the second electroconductive film 13C2 extending inside the pair of openings A1 and A2 provided on both sides of the semiconductor layer 13A made it possible to reduce a flicker value. In addition, it is found that the provision of the electrically floating light-shielding film 51 in the layer above the semiconductor layer 13A made it possible to reduce the flicker value further. Moreover, it is found that the electrical coupling between the scanning line WSL and the gate electrode 13C using the second electroconductive film made it possible to reduce the resistance value of the coupling part between the scanning line WSL and the gate electrode 13C.

Although the first and second embodiments and the modification example have been described above, the disclosed content is not limited thereto, and may be modified in a variety of ways. For example, the foregoing embodiments and the like exemplify the case where the film formation region of each of the alignment films 18 and 23 has the rectangular shape, but the disclosed content is also applicable to an alignment film having a shape other than the rectangular shape. For example, an alignment film may have a shape such as a square shape, and is useful, in particular, in a case where the alignment film has a shape including a corner part.

Further, the structure in the gate electrode 13C (and the gate electrode 63C), the openings A1 and A2, and the like of the disclosure is not limited to projection-type display units, and is applicable to all semiconductor devices that involve light shielding. Moreover, the foregoing embodiments and the like refer to the example in which the liquid crystal element is used as the display element, but this is not limitative; for example, an organic EL element or a CLED may be used.

It is to be noted that the semiconductor device and the projection-type display unit of the disclosure may have the following configurations.

(1)
A semiconductor device including:
a first substrate;
a TFT element provided on the first substrate with a first interlayer insulating layer interposed therebetween, the TFT element including a semiconductor layer and a gate electrode that is provided on the semiconductor layer with a gate insulating layer interposed therebetween; and
a second substrate disposed to face the first substrate, in which
the gate electrode includes a first electroconductive film and a second electroconductive film that has a light-shielding property in order from side of the semiconductor layer, and
the second electroconductive film extends from a side face to a bottom face of each of a pair of openings that are provided to interpose the semiconductor layer.

(2)
The semiconductor device according to (1), further including a scanning line between the first substrate and the first interlayer insulating layer, in which
the pair of openings each penetrate the first interlayer insulating layer and the gate insulating layer, and
the second electroconductive film is electrically coupled to the scanning line at the bottom face of each of the pair of openings.

(3)
The semiconductor device according to (1) or (2), further including a light-shielding film that is provided on the TFT element with a second interlayer insulating layer interposed therebetween.

(4)
The semiconductor device according to any one of (1) to (3), in which the second electroconductive film includes a laminated film that includes a plurality of layers.

(5)
The semiconductor device according to any one of (1) to (4), in which the semiconductor layer includes a LDD region.

(6)
The semiconductor device according to (5), in which the pair of openings are provided to interpose the LDD region of the semiconductor layer.

(7)
The semiconductor device according to (5) or (6), in which the light-shielding film is provided in the LDD region.

(8)
The semiconductor device according to any one of (3) to (7), in which the light-shielding film extends from a side face to a bottom face of a concave part formed by each of the pair of openings.

(9)
The semiconductor device according to any one of (3) to (8), in which a total film thickness of the second electroconductive film, the second interlayer insulating layer, and the light-shielding film is smaller than a minor axis of each of the pair of openings.

(10)
The semiconductor device according to any one of (1) to (9), in which the second electroconductive film is formed using a low refractive index material.

(11)
A projection-type display unit including:
a first substrate;
a TFT element provided on the first substrate with a first interlayer insulating layer interposed therebetween, the TFT element including a semiconductor layer and a gate electrode that is provided on the semiconductor layer with a gate insulating layer interposed therebetween;
a second substrate disposed to face the first substrate; and
a display layer provided between the first substrate and the second substrate, in which the gate electrode includes a first electroconductive film and a second electroconductive film that has a light-shielding property in order from side of the semiconductor layer, and the second electroconductive film extends from a side face to a bottom face of each of a pair of openings that are provided to interpose the semiconductor layer.

This application claims the benefit of Japanese Priority Patent Application No. 2015-225702 filed with the Japan Patent Office on Nov. 18, 2015, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A semiconductor device comprising:
a first substrate;
a TFT element provided on the first substrate with a first interlayer insulating layer interposed therebetween, the TFT element including a semiconductor layer and a gate electrode that is provided on the semiconductor layer with a gate insulating layer interposed therebetween; and
a second substrate disposed to face the first substrate, wherein
the gate electrode includes a first electroconductive film and a second electroconductive film that has a light-shielding property in order from side of the semiconductor layer, and
the second electroconductive film extends from a side face to a bottom face of each of a pair of openings that are provided to interpose the semiconductor layer.

2. The semiconductor device according to claim 1, further comprising a scanning line between the first substrate and the first interlayer insulating layer, wherein
the pair of openings each penetrate the first interlayer insulating layer and the gate insulating layer, and
the second electroconductive film is electrically coupled to the scanning line at the bottom face of each of the pair of openings.

3. The semiconductor device according to claim 1, wherein the second electroconductive film comprises a laminated film that includes a plurality of layers.

4. The semiconductor device according to claim 1, wherein the second electroconductive film is formed using a low refractive index material.

5. The semiconductor device according to claim 1, further comprising a light-shielding film that is provided on the TFT element with a second interlayer insulating layer interposed therebetween.

6. The semiconductor device according to claim 5, wherein the light-shielding film is provided in the LDD region.

7. The semiconductor device according to claim 3, wherein the light-shielding film extends from a side face to a bottom face of a concave part formed by each of the pair of openings.

8. The semiconductor device according to claim 5, wherein a total film thickness of the second electroconductive film, the second interlayer insulating layer, and the light-shielding film is smaller than a minor axis of each of the pair of openings.

9. The semiconductor device according to claim 1, wherein the semiconductor layer includes a LDD region.

10. The semiconductor device according to claim 9, wherein the pair of openings are provided to interpose the LDD region of the semiconductor layer.

11. A projection-type display unit comprising:
a first substrate;
a TFT element provided on the first substrate with a first interlayer insulating layer interposed therebetween, the TFT element including a semiconductor layer and a gate electrode that is provided on the semiconductor layer with a gate insulating layer interposed therebetween;
a second substrate disposed to face the first substrate; and
a display layer provided between the first substrate and the second substrate, wherein
the gate electrode includes a first electroconductive film and a second electroconductive film that has a light-shielding property in order from side of the semiconductor layer, and
the second electroconductive film extends from a side face to a bottom face of each of a pair of openings that are provided to interpose the semiconductor layer.

* * * * *